United States Patent
Kawabata et al.

(10) Patent No.: US 6,758,262 B2
(45) Date of Patent: Jul. 6, 2004

(54) HEAT SINK, METHOD FOR MANUFACTURING SAME, AND PRESSING JIG

(75) Inventors: Kenya Kawabata, Tokyo (JP); Mikio Kuwahara, Tokyo (JP); Izumi Nakajima, Tokyo (JP); Takeshi Hyotani, Tokyo (JP); Takashi Mori, Tokyo (JP); Hajime Noda, Tokyo (JP); Takayuki Hikotani, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/981,778

(22) Filed: Oct. 17, 2001

(65) Prior Publication Data
US 2002/0070005 A1 Jun. 13, 2002

(30) Foreign Application Priority Data

| Oct. 25, 2000 | (JP) | 2000-325347 |
| Mar. 27, 2001 | (JP) | 2001-091242 |
| Sep. 6, 2001 | (JP) | 2001-270036 |
| Oct. 9, 2001 | (JP) | 2001-311857 |

(51) Int. Cl.$^7$ .............................................. F28F 7/00
(52) U.S. Cl. .................. 165/80.3; 29/890.03; 165/185; 361/697; 361/704; 257/722
(58) Field of Search ................ 165/80.3, 185; 29/890.03; 257/722; 361/703, 697, 710

(56) References Cited

U.S. PATENT DOCUMENTS

| 5,014,776 A | * | 5/1991 | Hess ........................... 165/185 |
| 5,499,450 A | * | 3/1996 | Jacoby .................... 29/890.03 |
| 5,542,176 A | * | 8/1996 | Serizawa et al. ......... 29/890.03 |
| 5,638,715 A | * | 6/1997 | Lipinski ................... 29/890.03 |
| 5,819,407 A | * | 10/1998 | Terada ..................... 29/890.03 |
| 5,950,721 A | * | 9/1999 | Bock et al. ................. 165/185 |
| 6,234,246 B1 | * | 5/2001 | Bock et al. ................. 165/185 |
| 6,263,956 B1 | * | 7/2001 | Tang et al. ................ 165/80.3 |
| 6,321,452 B1 | * | 11/2001 | Lin ......................... 29/890.03 |
| 6,520,248 B2 | * | 2/2003 | Gailus et al. .............. 165/80.3 |

FOREIGN PATENT DOCUMENTS

| JP | 2002324879 a | * | 11/2002 | ................. 165/185 |

* cited by examiner

*Primary Examiner*—Terrell McKinnon
(74) *Attorney, Agent, or Firm*—Oblon, Spivak, McClelland, Maier & Neustadt, P.C.

(57) ABSTRACT

There is provided a heat sink comprising a base plate provided with a plurality grooves and concave portions, each of which has a substantially trapezoidal cross section having a flat bottom face and inclined side faces and is formed into a tapered shape, formed between the adjacent grooves by plastic deformation; and a plurality of thin-sheet fins which are inserted in the grooves and are crimped from both sides by the inclined side faces formed by the plastic deformation of the concave portion.

26 Claims, 12 Drawing Sheets

HEAT SINK, METHOD FOR MANUFACTURING SAME, AND PRESSING JIG

BACKGROUND OF THE INVENTION

1. Field of the Invention

The present invention relates to a heat sink in which thin-sheet fins are crimped firmly, a method for manufacturing the heat sink, and a pressing jig used to manufacture the heat sink.

2. Description of Related Art

Conventionally, a heat sink is manufactured by a method described below as shown in FIG. 15(a). In this method, thin-sheet fins 30 are inserted in a plurality of grooves 20 formed in parallel in the surface of a base plate 61 to which the thin-sheet fins 30 are attached. A pressing end portion 50 of a pressing jig 60 is pressed against a portion 40 in the vicinity of both sides of each of the grooves 20. The pressing end portion 50 of the pressing jig 60 has a triangular cross section, i.e., a blade with sharp edge.

SUMMARY OF THE INVENTION

An embodiment of a heat sink of the present invention is a heat sink comprising a base plate provided with a plurality of grooves and concave portions, each of which concave portions has a substantially trapezoidal cross section having a flat bottom face and inclined side faces and is formed into a tapered shape, formed between the adjacent grooves by plastic deformation; and a plurality of thin-sheet fins which are inserted in the grooves and are crimped from both sides by the inclined side faces formed by the plastic deformation of the concave portions.

An embodiment of a method for manufacturing a heat sink of the present invention is a method for manufacturing a heat sink, comprising the steps of:

forming a plurality of grooves in the surface of a base plate to which thin-sheet fins are attached;

inserting the thin-sheet fins in the grooves; and forming concave portions, each of which has a substantially trapezoidal cross section having a flat bottom face and inclined side faces and is formed into a tapered shape, by plastic deformation in a portion in the vicinity of both sides of the groove in the surface to which the thin-sheet fins are attached, so that the thin-sheet fins are crimped in the grooves.

An embodiment of a pressing jig of the present invention is a pressing jig used in the manufacturing method for a heat sink, in which a pressing end portion of the pressing jig has a substantially trapezoidal cross section and is formed into a tapered shape.

DETAILED DESCRIPTION OF THE PREFERRED EMBODIMENTS

Figure 1:
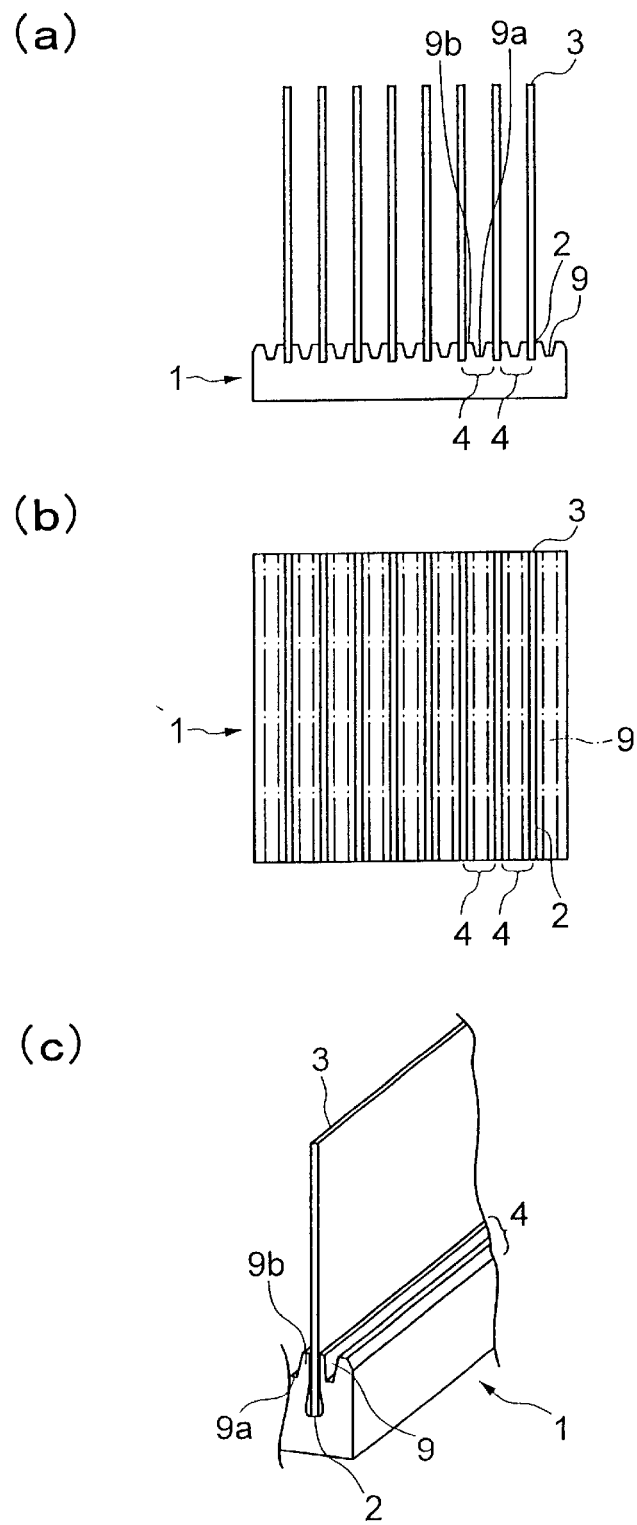
FIGS. 1(a), 1(b) and 1(c) are a side view, a plan view, and a partial perspective view, respectively, showing one embodiment of a heat sink in accordance with the present invention.

Embodiments in accordance with the present invention will now be described in detail with reference to the accompanying drawings.

In the figures for illustrating the embodiments, the same or similar reference numerals are applied to elements having the same or similar function, and the duplicated explanation is omitted.

An object of the present invention is to provide a heat sink having improved heat dissipating properties, in which thin-sheet fins are firmly crimped in grooves in a base plate, a method for manufacturing the heat sink, and a pressing jig used to manufacture the heat sink.

The inventor intensively carried on studies. As a result, it was found that by increasing the amount of plastic deformation, plastic deformation is caused to occur down to a deep position of the groove in which the thin-sheet fin is inserted, thus the accuracy of the proper crimping is enhanced, and the heat dissipating properties are improved. Furthermore, it was found that when concave portions each having a substantially trapezoidal cross section having a flat bottom face and inclined side faces and formed into a tapered shape by plastic deformation are provided between the adjacent grooves in the base plate, the amount of plastic deformation is increased.

A heat sink in accordance with the present invention includes a base plate provided with a plurality grooves and concave portions, each of which has a substantially trapezoidal cross section having a flat bottom face and inclined side faces and is formed into a tapered shape, formed between the adjacent grooves by plastic deformation; and > a plurality of thin-sheet fins which are inserted in the grooves and are crimped from both sides by the inclined side faces formed by the plastic deformation of the concave portion. The concave portions are formed continuously. Furthermore, the concave portions may be formed discontinuously. discontinuously. Furthermore, the heat sink may be such that the concave portions may be arranged in a zigzag manner. Furthermore, the heat sink may be such that the base plate comprises a heat pipe.

FIGS. 1(a), 1(b) and 1(c) are a side view, a plan view, and a partial perspective view, respectively, showing one embodiment of a heat sink in accordance with the present invention.

In the heat sink of this embodiment, thin-sheet fins 3 are inserted in a plurality of grooves 2 formed in parallel in the surface of a base plate 1 to which the thin-sheet fins 3 are attached, and concave portions 9, each of which has a substantially trapezoidal cross section having a flat bottom face 9a and inclined side faces 9b and is formed into a tapered shape, are formed continuously (i.e., without intermittence) by plastic deformation in a portion 4 in the vicinity of both sides of the groove 2 in the surface of the base plate to which the thin-sheet fins 3 are attached. By this plastic deformation, the thin-sheet fin 3 is crimped in the groove 2. The above-described concave portions 9, each of which has a substantially trapezoidal cross section and is formed into a tapered shape, are formed continuously along the groove 2.

As shown in FIG. 1(c), since the concave portion 9 formed continuously by plastic deformation in a portion 4 in the vicinity of both sides of the groove 2 in the surface of the base plate, to which the thin-sheet fins 3 are attached, is provided so as to have a substantially trapezoidal cross section and be formed into a tapered shape, the amount of plastic deformation is large, and therefore the inclined side face 9b is pressed against the thin-sheet fin 3, and at the same time compressed down to a deep position of the groove 2. Thereby, the thin-sheet fin 3 is firmly crimped from both sides by the side faces 9b of the grooves 2 in a wide area. The above-mentioned continuously formed concave portion means that each of the concave portions comprises a straight concave portion running continuously along the thin-sheet fin.

A heat sink in accordance with the present invention is manufactured through the steps of:

> forming a plurality of grooves in the surface of a base plate to which thin-sheet fins are attached;
> 
> inserting the thin-sheet fins in the grooves; and
> 
> forming concave portions, each of which has a substantially trapezoidal cross section having a flat bottom face and inclined side faces and is formed into a tapered shape, by plastic deformation in a portion in the vicinity of both sides of the groove in the surface to which the thin-sheet fins are attached, so that the thin-sheet fins are crimped in the grooves.

Furthermore, a heat sink in accordance with the present invention is manufactured through the steps of:

> forming a plurality of grooves in the surface of a base plate to which thin-sheet fins are attached;
> 
> inserting the thin-sheet fins in the grooves; and
> 
> applying plastic deformation to a portion in vicinity of both sides of the groove by pressing the portion in the vicinity of both sides of the groove in the surface to which the thin-sheet fins are attached by using a pressing end portion of a pressing jig, the pressing end portion having a substantially trapezoidal cross section and formed into a tapered shape, so that the thin-sheet fins are crimped in the grooves by the plastic deformation. This method is a method for manufacturing a heat sink in which the plastic deformation is continuously applied to the portion in the vicinity of both sides of the groove. Furthermore, the manufacturing method for a heat sink may be such that the plastic deformation is discontinuously applied to the portion in the vicinity of both sides of the groove. Furthermore, the manufacturing method for a heat sink may be such that a shape of the cross section of the pressing end portion comprises forked blades and each of the forked blades has a trapezoidal cross section and is formed into a tapered shape. Furthermore, the manufacturing method for a heat sink may be such that the plastic deformation is effected in a zigzag arrangement. Furthermore, the manufacturing method for a heat sink may be such that the plastic deformation is effected at an angle within 45 degrees with respect to the thin-sheet fin.

More specifically, the heat sink of the above-described embodiment of the present invention is manufactured as follows: as shown in FIGS. 2(a) and 2(b), the thin-sheet fins 3 are inserted in the grooves 2 formed in parallel in the surface of the base plate 1 to which the thin-sheet fins 3 are attached, and then the portion 4 in the vicinity of both sides of the groove 2 in the surface of the base plate 1 to which the thin-sheet fins 3 are attached is pressed by a pressing end portion 5 of a pressing jig 6. The pressing end portion 5 has a substantially trapezoidal cross section and being formed into a tapered shape.

One embodiment of a pressing jig in accordance with the present invention is a pressing jig used in the manufacturing method for the above-described heat sink, in which the pressing end portion thereof has a substantially trapezoidal cross section and is formed into a tapered shape. Furthermore, another embodiment of a pressing jig in accordance with the present invention is a pressing jig used in the manufacturing method for the above-described heat sink, in which prescribed locations of the pressing end portion project, and each of the projecting portions has a substantially trapezoidal cross section and is formed into a tapered shape.

Figure 3:
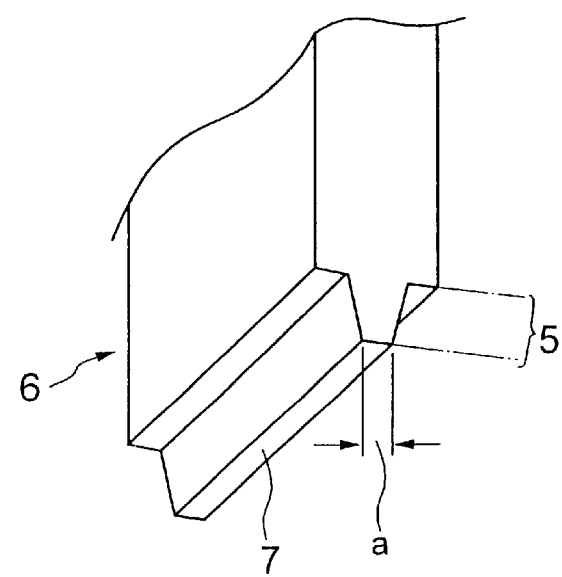
FIG. 3 is a perspective view of a pressing end portion of a pressing jig used to manufacture the heat sink shown in FIG. 1.

More specifically, the pressing jig 6 has, as shown in FIG. 3, the pressing end portion 5 which has a substantially trapezoidal cross section and is formed into a tapered shape, and the width a of a tip end face 7 is determined based on the material and quality of the pressing jig 6, the groove interval on the surface to which the thin-sheet fins are attached, and the like.

The pressing jig 6 in accordance with the present invention can be used steadily without being broken because the tip end face 7 of the pressing end portion 5 is flat.

If the width a of the tip end portion 7 is smaller than a prescribed value, the amount of plastic deformation is insufficient, and thus the inclined side face 9b is not compressed down to a deep position of the groove 2. On the other hand, if the width a of the tip end portion 7 exceeds a prescribed value and is too large, the pressing resistance increases, so that the pressing end portion 5 of the pressing jig 6 cannot be pressed sufficiently in the base plate 1. In both cases, poor crimping of the thin-sheet fin is liable to occur. Furthermore, since the contact surface of the thin-sheet fin with the side faces of the groove 2 is small, the heat dissipating properties are deteriorated.

Usually, the width a of the tip end face 7 is preferably within the range of from 0.1 to 0.5 mm.

Furthermore, in the heat sink in accordance with the present invention, the aforementioned concave portions may be formed discontinuously.

Figure 4:
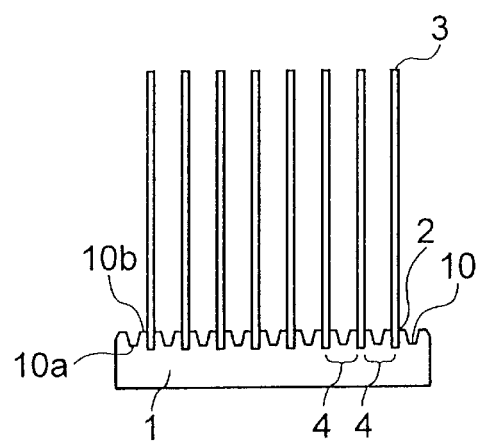
FIGS. 4(a), 4(b) and 4(c) are a side view, a plan view, and a partial perspective view, respectively, showing another embodiment of a heat sink in accordance with the present invention.
Figure 4:
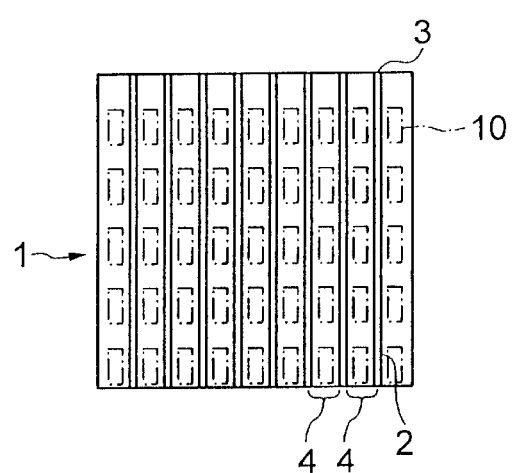
Figure 4:
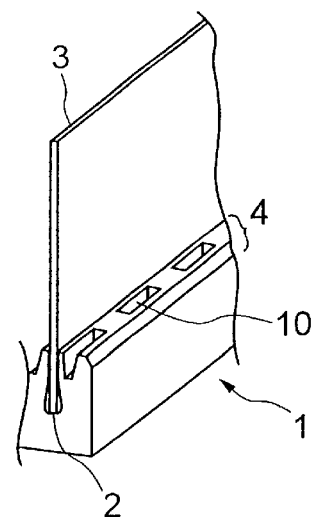

FIGS. 4(*a*), 4(*b*) and 4(*c*) are a side view, a plan view, and a partial perspective view, respectively, showing another embodiment of a heat sink in accordance with the present invention.

As shown in FIGS. 4(*a*), 4(*b*) and 4(*c*), in the heat sink of this embodiment, the thin-sheet fins 3 are inserted in the grooves 2 formed in the surface of the base plate 1 to which the thin-sheet fins 3 are attached, and concave portions 10, each of which has a substantially trapezoidal cross section having a flat bottom face 10*a* and inclined side faces 10*b* and is formed into a tapered shape, are formed discontinuously by plastic deformation in the portion 4 in the vicinity of both sides of the groove in the surface in the base plate to which the thin-sheet fins are attached. By this plastic deformation, the thin-sheet fin 3 is crimped in the groove 2. The above-described concave portions 10, each of which has a substantially trapezoidal cross section and is formed into a tapered shape, are formed discontinuously at predetermined intervals along the groove 2. The above-mentioned discontinuously formed concave portions means that each of the concave portions comprises a plurality of sub-concave portions running discontinuously with a prescribed interval along the thin-sheet fin.

Figure 2:
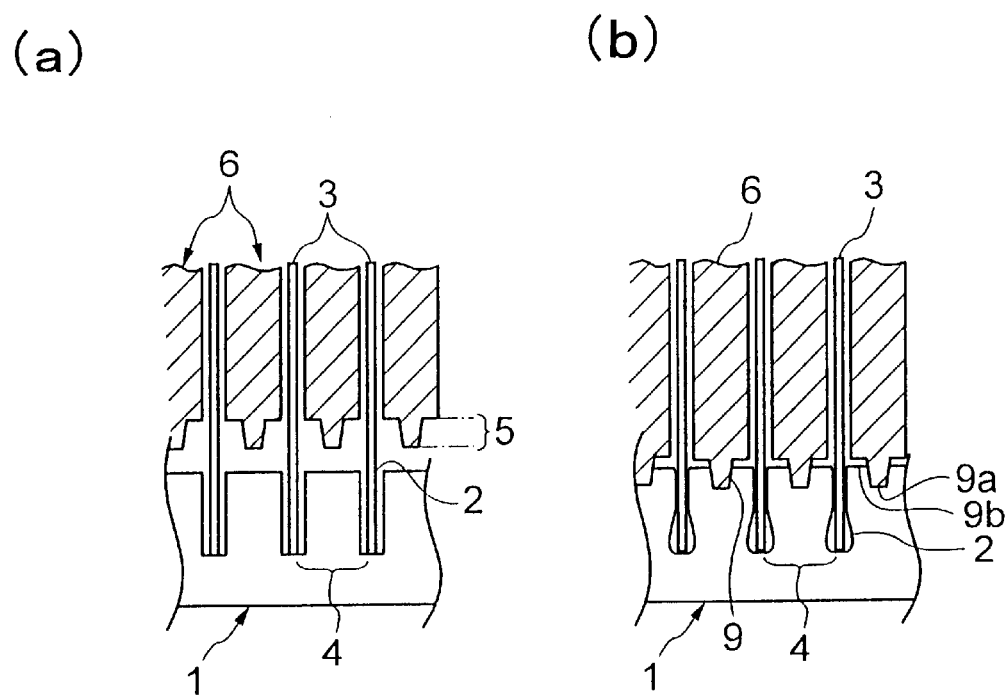
FIGS. 2(a) and 2(b) are schematic sectional views for illustrating a manufacturing process for the heat sink shown in FIG. 1.

This heat sink is manufactured by the same method as shown in FIGS. 2(*a*) and 2(*b*) except that the concave portions 10 are formed discontinuously at predetermined intervals along the groove 2.

Furthermore, another embodiment of a pressing jig in accordance with the present invention is a pressing jig used in the manufacturing method for the heat sink, in which prescribed locations of the pressing end portion project, and each of the projecting portions has a substantially trapezoidal cross section and is formed into a tapered shape.

Figure 5:
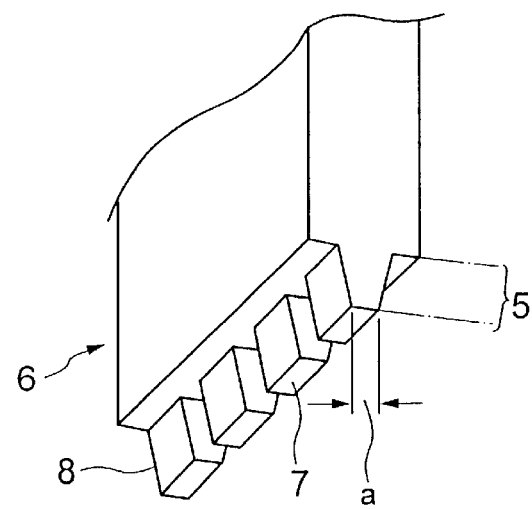
FIG. 5 is a perspective view of a pressing end portion of a pressing jig used to manufacture the heat sink shown in FIG. 4.

More specifically, this pressing jig 6 is configured, as shown in FIG. 5, so that the pressing end portion 5 projects discontinuously at predetermined intervals, and each of the projecting portions 8 has a substantially trapezoidal cross section and is formed into a tapered shape. The effect of the width a of the tip end face 7, the method for determining the width a, the desirable range of the width a, and the like are the same as those in the case of the pressing jig of the embodiment shown in FIG. 3.

As shown in FIG. 5, the locations at which the projecting portions 8 of the pressing jig 6 are formed are locations necessary to properly crimp the thin-sheet fin 3 in the groove 2. The size and interval of the projecting portion 8 are determined based on the material, quality, shape, etc. of the base plate 1 and the thin-sheet fin 3. According to the pressing jig 6 of this embodiment, since the projecting portions 8 for pressing the portion 4 in the vicinity of both sides of the groove in the surface of the base plate to which the thin-sheet fins are attached (see FIG. 4(*b*)) are present at only required locations (more specifically, disposed at predetermined intervals), the crimping can be performed by means of a small pressing force as compared with the pressing jig 6 of the embodiment shown in FIG. 3.

Furthermore, a portion that is not pressed by the projecting portion 8 is at the same time compressed in the length direction of the groove 2 from both sides, and thus forced to be expanded in the width direction of the groove 2 by the adjacent projecting portions 8, so that the width of the groove 2 in the corresponding portion decreases, and thus a crimping force is applied to the thin-sheet fin 3.

In FIGS. 4(*a*), 4(*b*) and 4(*c*), reference numeral 10 denotes the concave portion which has a substantially trapezoidal cross section having the flat bottom face 10*a* and the inclined side faces 10*b* and is formed into a tapered shape, and is formed discontinuously at prescribed intervals in the portion 4 in the vicinity of both sides of the groove in the surface of the base plate to which the thin-sheet fins are attached. The concave portion is a plastically deformed portion.

Figure 6:
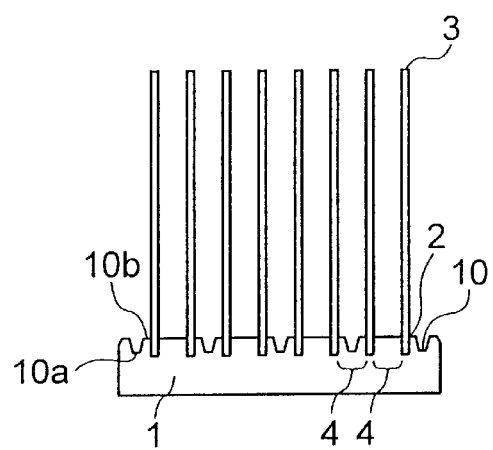
FIGS. 6(a) and 6(b) are a side view and a plan view, respectively, showing other embodiment of a heat sink in accordance with the present invention.
Figure 6:
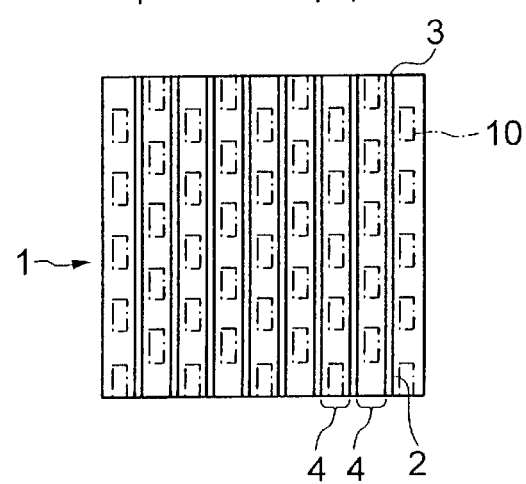

FIGS. 6(*a*) and 6(*b*) are a side view and a plan view, respectively, showing further another embodiment of a heat sink in accordance with the present invention.

In the heat sink of this embodiment, the plastically deformed portions, each of which has a substantially trapezoidal cross section and is formed into a tapered shape, are formed discontinuously in a zigzag arrangement on both sides of the groove 2 in the portion 4 in the vicinity of both sides of the groove 2 in the surface to which the thin-sheet fins 3 are attached. According to the heat sink of this embodiment, the crimping force can be made uniform in the length direction of the groove 2, and also the pressing force of the pressing jig 6 can be made small.

In the present invention, the above-described pressing jig can be made of an ordinary high-strength material such as steel. Also, the base plate and the thin-sheet fin can be made of any material with high heat conductivity such as copper and aluminum.

Figure 7:
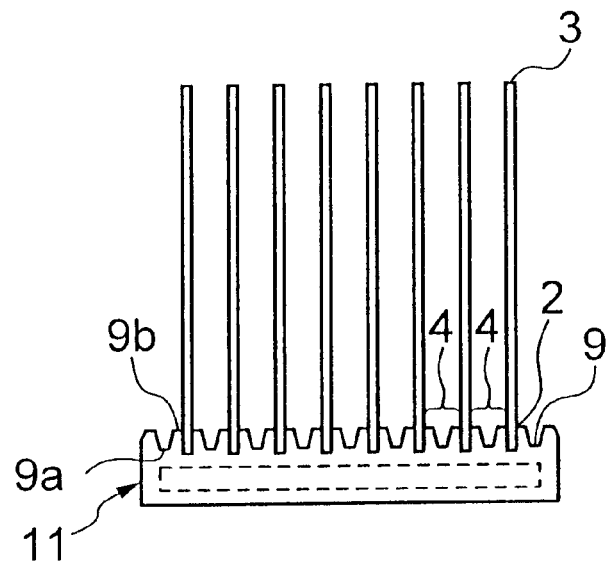
FIG. 7 is a side view showing other embodiment of a heat sink in accordance with the present invention.

FIG. 7 is a side view showing other embodiment of a heat sink in accordance with the present invention.

In the heat sink tank of this embodiment, the base plate 1 of the heat sink comprises a plate-shaped heat pipe 11.

Figure 8:
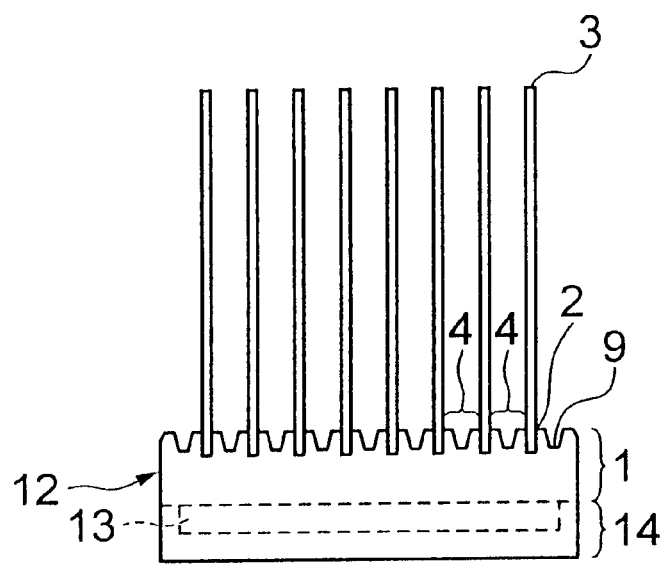
FIG. 8 is a side view showing other embodiment of a heat sink in accordance with the present invention.

FIG. 8 is a side view showing other embodiment of a heat sink in accordance with the present invention.

In the heat sink of this embodiment, the base plate 1 of the heat sink comprises one component member of a plate-shaped heat pipe 12, for example, an upper plate member of the heat pipe.

This heat sink can be manufactured easily by joining a plate member 14 provided with a recessed portion 13 to the lower side of the base plate 1 of the heat sink of the embodiment shown in FIG. 1 to form a hermetically sealed cavity portion, and by sealing a working fluid in the cavity portion.

Figure 9:
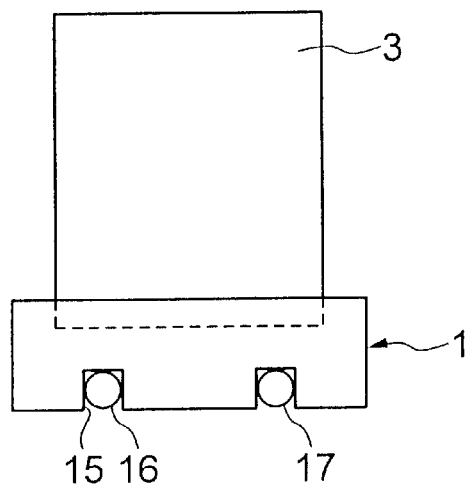
FIGS. 9(a) and 9(b) are a front view and a side view, respectively, showing other embodiment of a heat sink in accordance with the present invention.
Figure 9:
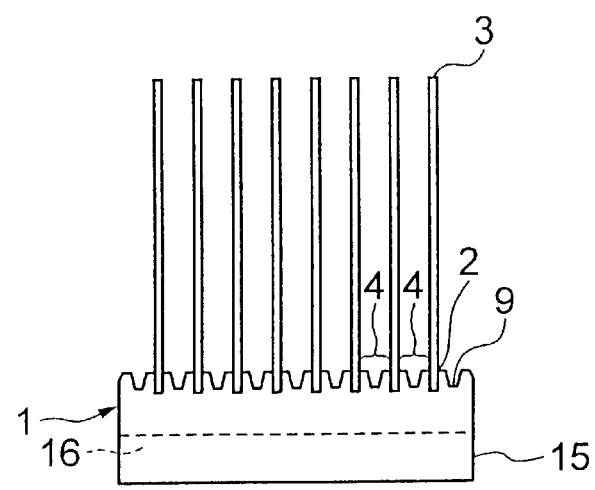

FIGS. 9(*a*) and 9(*b*) are a front view and a side view, respectively, showing other embodiment of a heat sink in accordance with the present invention.

In the heat sink of this embodiment, another grooves 15 are formed at the prescribed locations of the base plate 1 of the heat sink of the embodiment shown in FIG. 1, and a round pipe-shaped heat pipe 16 is joined to the another groove 15 by means of solder 17.

If the another groove 15 is formed so as to run crossing the length direction of the fin 3, the heat transfer by the round pipe-shaped heat pipe is effectively achieved.

In the heat sinks of the embodiments shown in FIGS. 7 to 9, since the heat transferred to the base plate 1 is transferred rapidly by the heat pipe 11, 12, 16, heat diffusion in the base plate 1 is effected efficiently, so that the heat dissipating properties of the heat sink are improved.

In the heat sinks of the embodiments shown in FIGS. 7 to 9, the concave portions for crimping the thin-sheet fin 3 may be provided continuously or discontinuously.

FIGS. 10(a) to 10(d) are views showing other embodiment of a heat sink in accordance with the present invention.

The heat sink of this embodiment includes a base plate and a plurality of thin-sheet fins. The base plate is provided with a plurality of grooves and concave portions, each of which has a substantially trapezoidal cross section having a flat bottom face and inclined side faces and is formed into a tapered shape, formed between the adjacent grooves by plastic deformation. The thin-sheet fin is inserted in the groove and is crimped from both sides by the inclined side faces formed by plastic deformation of the concave portion.

FIG. 10(a) shows one thin-sheet fin which is inserted in the groove in the base plate and is crimped from both sides by the inclined side faces formed by plastic deformation of the concave portion.

FIGS. 10(b) and 10(c) are views for illustrating the crimping operation of the thin-sheet fin. FIG. 10(d) is a view showing the thin-sheet fin crimped in the groove in the base plate. As shown in FIG. 10(b), the thin-sheet fin 3 is inserted in the groove 2 in the base plate 1. Then, as shown in FIG. 10(c), a pressing jig with a tip end portion, which has a substantially trapezoidal cross section and is formed into a tapered shape, is pressed down to a predetermined depth in a portion in the vicinity of both sides of the groove 2 in the surface of the base plate to which the thin-sheet fins 3 are attached. As a result, as shown in FIG. 10(d), there are provided concave portions plastically deformed by the pressing of the pressing jig at both sides of the thin-sheet fin, each of which concave portions has a substantially trapezoidal cross section having a flat bottom face 12b and inclined side faces 12a and is formed into a tapered shape. The thin-sheet fin 3 inserted in the groove 2 is crimped from both sides by the inclined side faces formed by plastic deformation of the concave portion.

According to the heat sink in accordance with the present invention, since the concave portions, each of which has a substantially trapezoidal cross section having the flat bottom face 12b and the inclined side faces 12a and is formed into a tapered shape, are formed by the pressing of the pressing jig and thus by plastic deformation, the amount of plastic deformation is large, so that the thin-sheet fin 3 inserted in the groove 2 is crimped from both sides in a wide area. Therefore, the accuracy of the proper crimping is enhanced, and the contact area of the thin-sheet fin with the base plate increases, thus the heat dissipating properties are enhanced.

FIGS. 11(a) and 11(b) are views showing other embodiment of a heat sink in accordance with the present invention. In the heat sink of this embodiment, a pressing jig, in which the shape of the cross section of a pressing end portion thereof comprises forked blades and each of the forked blades has a trapezoidal cross section and is formed into a tapered shape, is inserted between the adjacent thin-sheet fins and is pressed in portions in the vicinity of the thin-sheet fin, by which two concave portions are formed.

More specifically, as shown by a portion encircled by a dotted line in FIG. 11(a), the pressing jig 6 has the pressing end portion comprising forked blades 61 and 62 in cross section. Furthermore, each of the forked blades 61 and 62 has a trapezoidal cross section and is formed into a tapered shape. Each of the blades is pressed in a position at a predetermined distance from the thin-sheet fin 3 inserted in the groove 2 in the base plate 1.

As shown in FIG. 11(b), the heat sink of this embodiment includes a base plate and a plurality of thin-sheet fins. The base plate is provided with a plurality of grooves 2 and a pair of plastically formed concave portions formed between the adjacent grooves, each of which concave portions has a substantially trapezoidal cross section having a flat bottom face and inclined side faces and is formed into a tapered shape. The thin-sheet fin is inserted in the grooves 2 and is crimped from both sides by the inclined side faces formed by plastic deformation of the concave portion.

More specifically, the thin-sheet fin 3 is inserted in the groove 2 in the base plate 1. Then, as shown in FIG. 11(a), a pressing jig 6 with forked blades, each of which has a trapezoidal cross section and is formed into a tapered shape, is inserted between the adjacent thin-sheet fins 3, 3 and is pressed down to a predetermined depth. As a result, as shown in FIG. 11(b), a pair of (i.e., two) concave portions, each of which has a substantially trapezoidal cross section having a flat bottom face 12b and inclined side faces 12a and is formed into a tapered shape, formed by the pressing of the pressing jig and thus by plastic deformation are provided at positions close to the thin-sheet fin between the adjacent thin-sheet fins. Although not shown in the figure, a pressing jig is likewise inserted in an adjacent space between the thin-sheet fins and is pressed, so that each thin-sheet fin inserted in the groove is crimped from both sides by the inclined side faces 12a formed by plastic deformation of the concave portion.

In this heat sink in accordance with the present invention as well, since the two concave portions, each of which has a substantially trapezoidal cross section having the flat bottom face 12b and the inclined side faces 12a and is formed into a tapered shape, are formed between the thin-sheet fins by the pressing of the pressing jig and thus by plastic deformation, the amount of plastic deformation is large, so that the thin-sheet fin 3 inserted in the groove 2 can be crimped from both sides in a wide area. Therefore, the accuracy of the proper crimping is enhanced, and the contact area of the thin-sheet fin with the base plate increases, so that the heat dissipating properties are enhanced.

Figure 12:
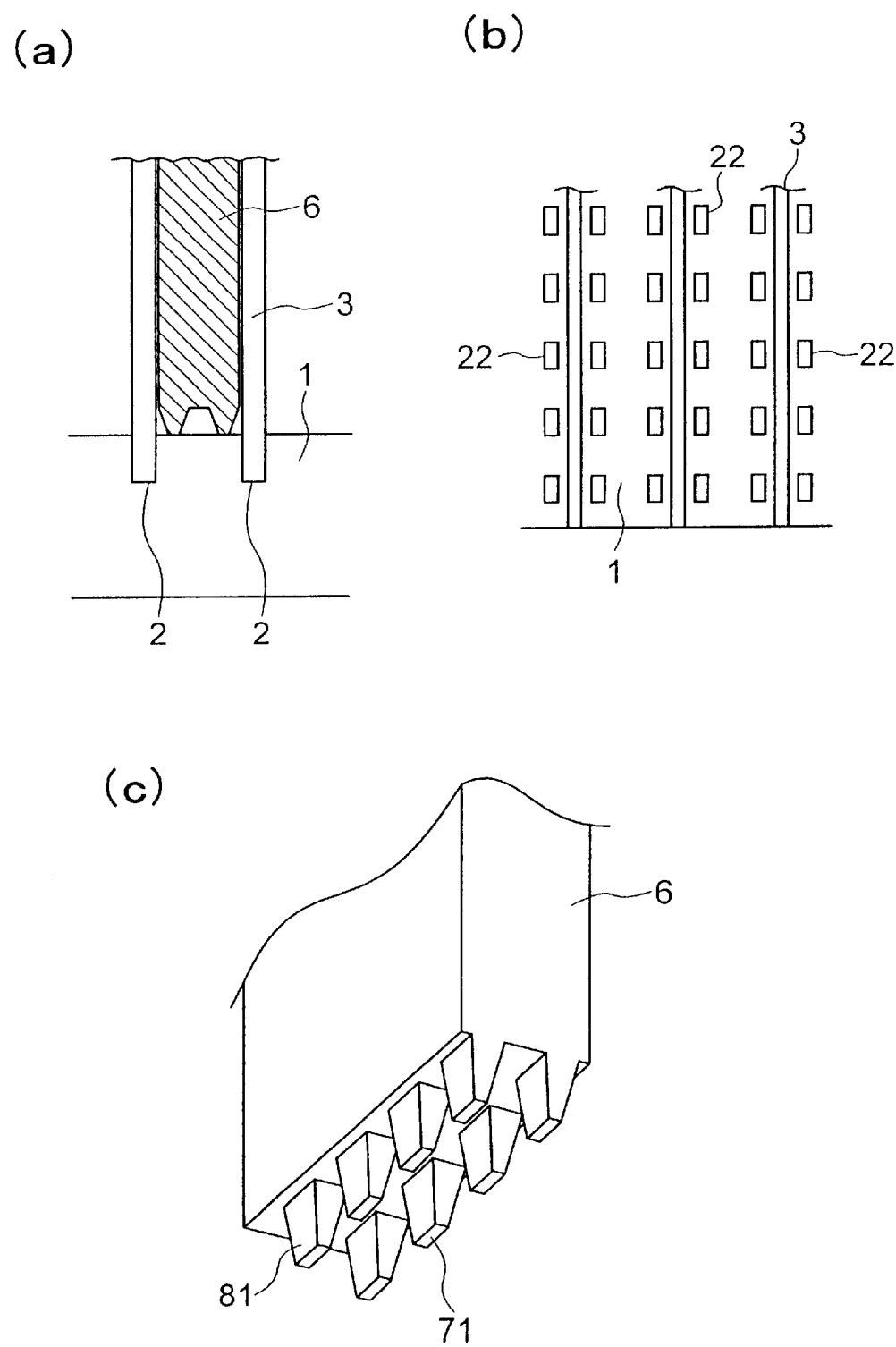
FIGS. 12(a), 12(b) and 12(c) are views showing other embodiment of a heat sink in accordance with the present invention.

FIG. 12 shows other embodiment of a heat sink in accordance with the present invention. FIG. 12(a) is a sectional view, and FIG. 12(b) is a plan view. FIG. 12(c) is an explanatory view of a pressing end portion. In the heat sink of this embodiment, a pressing jig having a pressing end portion provided with a plurality of projecting portions projecting in two rows along the lengthwise direction of the jig is inserted between the adjacent thin-sheet fins and is pressed, by which a plurality of concave portions 22 disposed in two rows are formed. The cross section of a portion at which the projecting portions project comprises forked blades. Each of the above-described forked blades has a substantially trapezoidal cross section and is formed into a tapered shape.

As shown in FIG. 12(c), in the pressing end portion of the pressing jig 6, projecting portions 81 are provided in two rows along the lengthwise direction of the jig. Each of the projecting portions 81 in the row is located at the corresponding position to the respective projecting portions in other row, as shown in FIG. 12(c). A tip end face 71 of the projecting portion 81 has a flat face.

As shown in FIG. 12(b), the concave portions 22, each of which has a substantially trapezoidal cross section having a flat face and inclined side faces and is formed into a tapered shape, are formed at predetermined intervals at both sides of the thin-sheet fin inserted in the groove in the base plate 1. More specifically, the corresponding concave portions 22 are provided at both sides of the thin-sheet fin.

As in the case shown in FIG. 11(b), the thin-sheet fin is crimped from both sides by the inclined side faces formed by the pressing of the pressing jig and thus by plastic deformation. Furthermore, as in the embodiment shown in FIG.

4, a portion that is not pressed by the projecting portion 8 is also compressed in the length direction of the groove 2 from both sides and forced to be expanded in the width direction of the groove 2 by the adjacent projecting portions, so that the width of the groove in the corresponding portion decreases, and thus a crimping force is applied to the thin-sheet fin 3.

Figure 13:
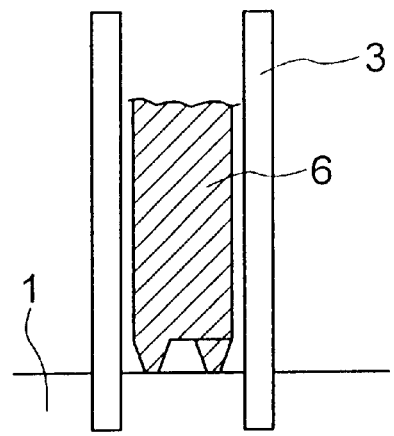
FIGS. 13(a) and 13(b) are a sectional view and a plan view, respectively, showing other embodiment of a heat sink in accordance with the present invention.
Figure 13:
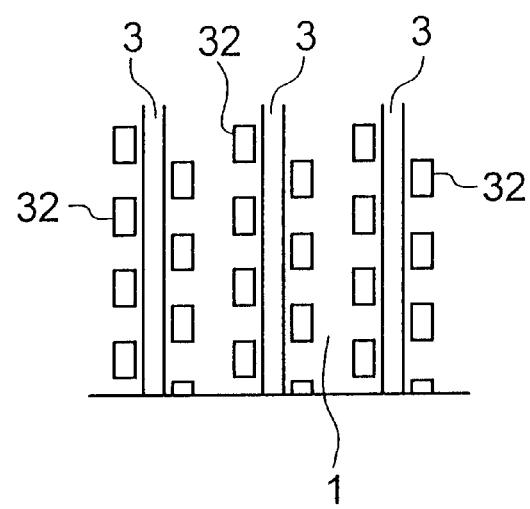

FIG. 13 shows other embodiment of a heat sink in accordance with the present invention. FIG. 13(a) is a sectional view, and FIG. 13(b) is a plan view. As shown in FIG. 13(a), a pressing jig having a pressing end portion provided with a plurality of projecting portions projecting in two rows in a zigzag form along the lengthwise direction of the jig is inserted between the adjacent thin-sheet fins and is pressed, by which a plurality of concave portions 32 disposed in two rows are formed. The cross section of a portion at which the projecting portions project forms forked blades. Each of the above-described forked blades has a substantially trapezoidal cross section and is formed into a tapered shape. More specifically, in the heat sink of this embodiment, the concave portions 32 formed at both sides of the thin-sheet fin are located in a zigzag arrangement at predetermined intervals. According to the heat sink of this embodiment, as in the embodiment shown in FIG. 6, the crimping force can be made uniform in the length direction of the thin-sheet fin 3, and also the pressing force of the pressing jig 6 can be made small.

Figure 14:
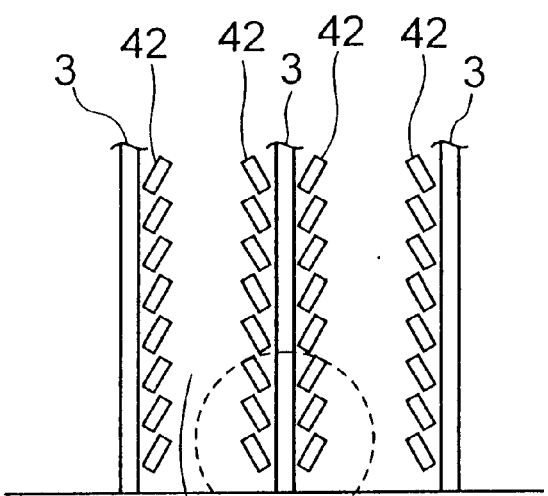
FIG. 14(a) is a plan view showing other embodiment of a heat sink in accordance with the present invention.
FIG. 14(b) is an enlarged view of a portion encircled by a dotted line in FIG. 14(a)
Figure 14:
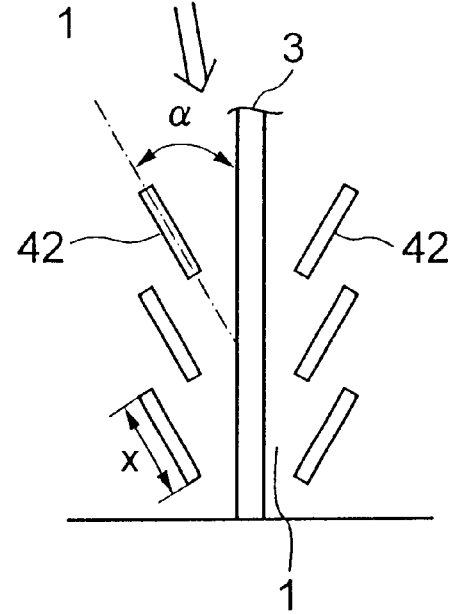

FIG. 14 shows still another embodiment of a heat sink in accordance with the present invention. FIG. 14(a) is a plan view, and FIG. 14(b) is an enlarged view of a portion encircled by a dotted line in FIG. 14(a). As shown in FIG. 14(a), a pressing jig having a pressing end portion provided with a plurality of projecting portions projecting in two rows in inclined arrangement along the lengthwise direction of the jig is inserted between the adjacent thin-sheet fins and is pressed, by which a plurality of concave portions 32 disposed in two rows in inclined arrangement are formed. The portion at which the projecting portions project comprises forked rectangular blades. Each of the above-described forked rectangular blades has a substantially trapezoidal cross section and is formed into a tapered shape, and the tip end portion thereof has a flat face. More specifically, in the heat sink of this embodiment, the concave portions 42 formed in parallel and in rows at both sides of the thin-sheet fin are located in inclined manner at predetermined intervals respectively so as to face each other correspondingly.

According to the heat sink of this embodiment, the crimping force is applied slantwise to the thin-sheet fin by the concave portions disposed in inclined arrangement, so that the accuracy of the proper crimping is enhanced. It is preferable that the angle formed by the longitudinal axis of each of the concave portions disposed in inclined arrangement and the longitudinal axis of the thin-sheet fin is within 45 degrees.

As described above, the pressing jig in accordance with the present invention is a pressing jig used in the manufacturing method of the above-described heat sink, in which the pressing end portion thereof is formed so as to have a substantially trapezoidal cross section and be formed into a tapered shape. Furthermore, the pressing jig in accordance with the present invention is configured so that prescribed locations of the pressing end portion project, and each of the projecting portions has a substantially trapezoidal cross section and is formed into a tapered shape. Furthermore, the pressing jig in accordance with the present invention is configured so that the cross section of the pressing end portion comprises forked blades and each of the forked blades has a substantially trapezoidal cross section and is formed into a tapered shape. Furthermore, the above-described forked blades may be discontinuously made.

Figure 15:
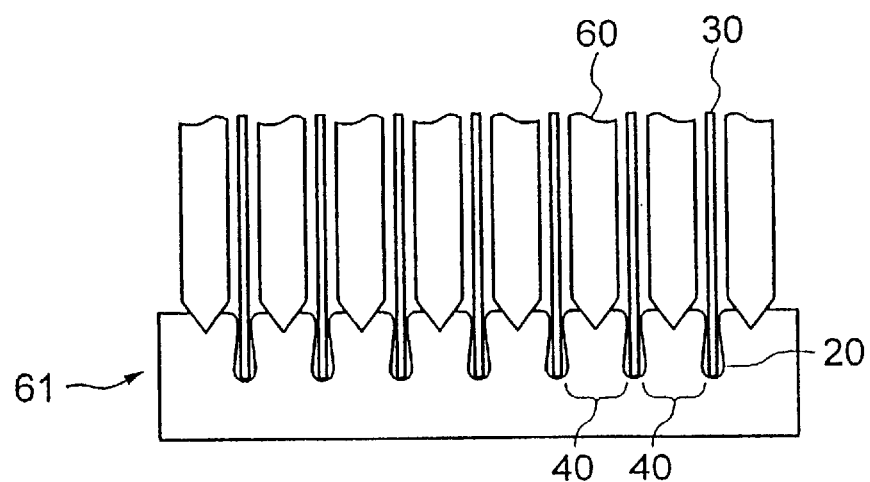
FIG. 15(a) is a side view for illustrating a manufacturing method for a conventional heat sink.
FIG. 15(b) is a perspective view of a pressing end portion of a pressing jig used to manufacture the conventional heat sink.
Figure 15:
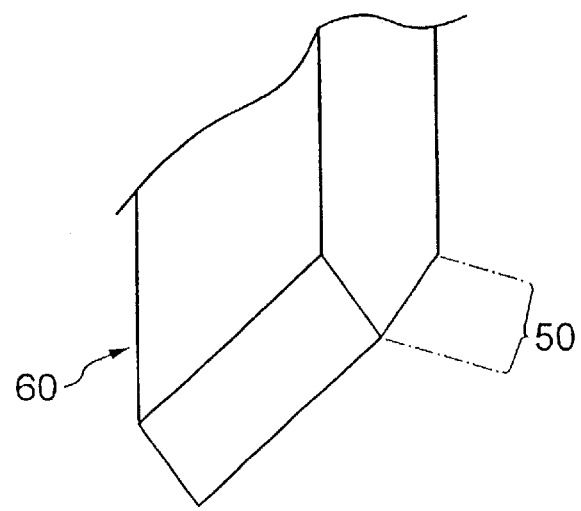

According to the present invention, the problem in the conventional heat sink and the method manufacturing same can be overcome. More specifically, in the conventional heat sink and method for manufacturing same as described with reference to FIG. 15(b), since the pressing end portion 50 of the pressing jig 60 has a triangular cross section, even if the pressing end portion 50 is pressed firmly against the surface of the base plate, plastic deformation is insufficient due to the sharp edge of pressing end 50, so that deformation does not reach deeper portions in the groove 20, and the thin-sheet fin 30 can be crimped only at a position near the inlet of the groove 20 (refer to FIG. 15(a)), thus the thin-sheet fin 30 may tilt or come off when being installed to an electronic part or when in use. In addition, since the tip end portion of the pressing jig 60 is sharp pointed, the tip end portion may be broken, so that it is difficult to perform the pressing operation steadily. On the contrary, in the present invention, as described above, the concave portion 9 formed by plastic deformation in a portion 4 in the vicinity of both sides of the groove 2 in the surface of the base plate is provided so as to have a substantially trapezoidal cross section and be formed into a tapered shape, the amount of plastic deformation is large, and therefore the inclined side face 9b is pressed against the thin-sheet fin 3, and at the same time compressed down to a deep position of the groove 2. Thereby, the thin-sheet fin 3 is firmly crimped from both sides by the side faces 9b of the grooves 2 in a wide area.

The heat sinks in accordance with the present invention will be described in more detail with reference to examples.

EXAMPLES

Example 1

Figure 10:
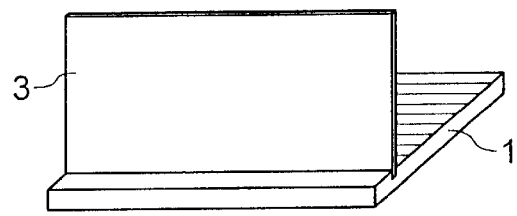
FIG. 10(a) is a view showing one thin-sheet fin which is inserted in a groove in a base plate and is crimped from both sides by inclined side faces formed by plastic deformation of a concave portion.
FIGS. 10(b) to 10(d) are views for illustrating the crimping operation of the thin-sheet fin.
Figure 10:
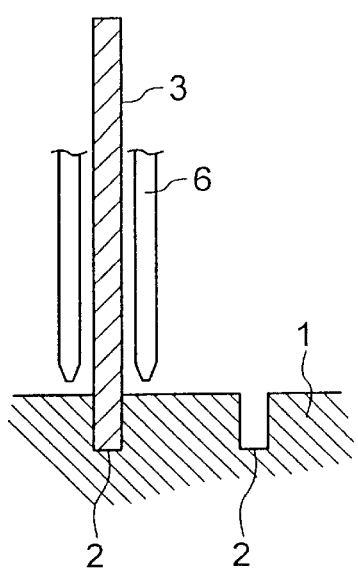
Figure 10:
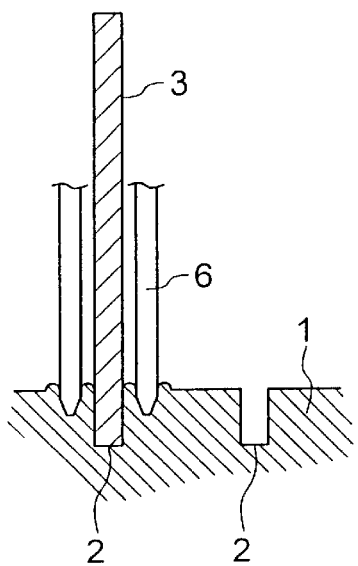
Figure 10:
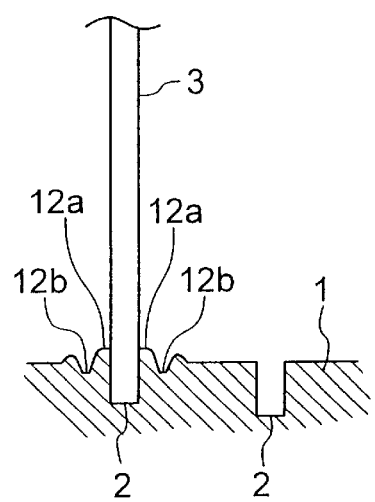

As shown in FIG. 10, sixteen grooves respectively having a width of 1.5 mm and a depth of 3.0 mm are formed at 12 mm intervals in an aluminum base plate with a width of 200 mm, a length of 300 mm, and a thickness of 12 mm. Sixteen aluminum fins respectively having a length of 300 mm, a height of 180 mm, and a thickness of 1.5 mm are inserted in the corresponding grooves. As shown in FIG. 10, two crimping blades are prepared so as to dispose the fin therebetween, and the tip ends of the blades are located respectively at positions 0.8 mm distant from the side face of the fin. The tip end portion of blade is tapered so as to have a cross-section of substantially trapezoidal shape, and the tip end has a flat face. The blades are pressed in the base plate, so that the base plate is plastically deformed fully. By means of such a sufficient amount of plastic deformation, the fin is firmly crimped in the base plate and is joined both thermally and mechanically.

As described above, since the pressing is performed by crimping blades so as to dispose the fin therebetween, even in the case where the interval between fins is large, a steady crimping strength can be obtained for individual fins. Also, since the distance from the fin to the blade tip end is determined in advance, the amount of deformation of the base plate is substantially fixed, so that it is unnecessary to take measures against the warp and expansion of the base plate each time.

Example 2

Figure 11:
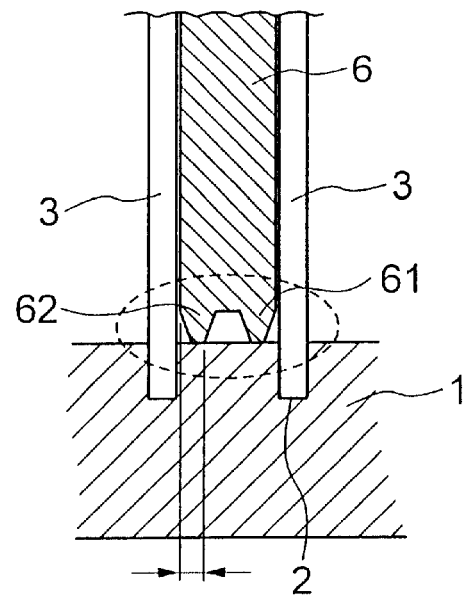
FIGS. 11(a) and 11(b) are views showing other embodiment of a heat sink in accordance with the present invention.
Figure 11:
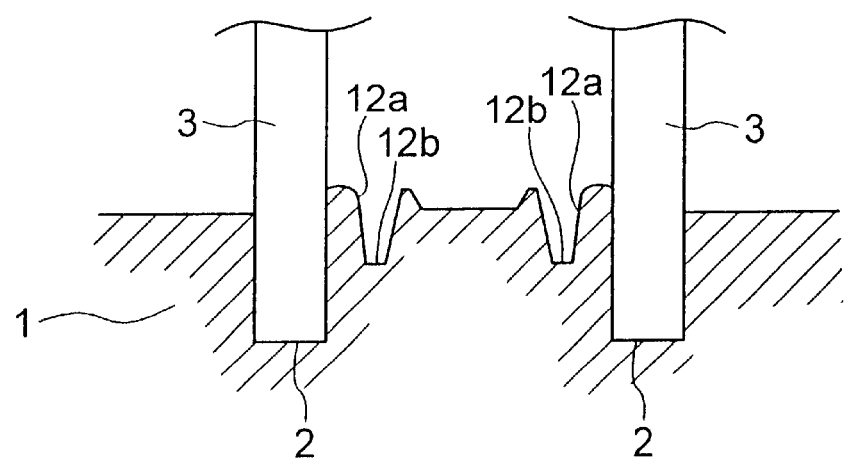

As shown in FIG. 11, twenty-nine grooves respectively having a width of 1.2 mm and a depth of 2.4 mm are formed at 10 mm intervals in an aluminum base plate with a width of 300 mm, a length of 300 mm, and a thickness of 10 mm. These grooves are formed by extrusion. The extrusion exceeding this size is not general because the equipment is limited severely especially in a shape in which fins are erected on this base plate. Twenty-nine aluminum fins respectively having a length of 300 mm, a height of 120 mm, and a thickness of 1.2 mm are inserted in the corresponding grooves in this base plate. Since as-inserted fins come off easily, a portion between the fins is pressed by twin crimping blades, having a forked cross section, with a blade thickness of 8.8 mm (corresponding the clearance between the fins) as shown in FIG. 11. The respective tip ends of the twin blades has a positional relationship such that the tip end cuts into the base plate at a position about 1 mm distant from the fin. The aluminum is deformed by applying a pressure, and this deformation is utilized as a crimping force for crimping the fin. By performing this operation in each space between the fins, the fins are integrated with the base plate.

As described above, by pressing the portion between the fins with the forked twin crimping blades, a steady crimping strength can be obtained even when the clearance between the fins is extremely small, and it is unnecessary to take measures against the warp and expansion of the base plate each time because the amount of deformation of the base plate is substantially fixed.

Example 3

As shown in FIG. 12, thirty-nine grooves respectively having a width of 1 mm and a depth of 2 mm are formed at 10 mm intervals in a copper base plate with a width of 400 mm, a length of 120 mm, and a thickness of 8 mm. These grooves are formed by cutting. Thirty-nine aluminum fins respectively having a length of 120 mm, a height of 100 mm, and a thickness of 1 mm are inserted in the corresponding grooves in this base plate. Since as-inserted fins come off easily, a portion between the fins is pressed by twin crimping blades, having a forked cross section, with a blade thickness of 9 mm (corresponding the clearance between the fins) as shown in FIG. 12. The respective tip ends of the twin blades has a positional relationship such that the tip end cuts into the base plate at a position about 1 mm distant from the fin. The copper is deformed by applying a pressure, and this deformation is utilized as a crimping force for crimping the fin. By performing this operation in each space between the fins, the fins are integrated with the base plate. Since copper has higher thermal conductivity but is harder than aluminum, a large force is necessary to deform copper. Therefore, in order to perform crimping with a relatively small force, the blade is formed discontinuously (i.e., a plurality of sub-blades run discontinuously with a prescribed interval along the thin-sheet fin) as shown in FIG. 12(c) so that necessary deformation can be obtained while the area in which the blade cuts into the base plate is decreased.

As described above, by pressing the portion between the fins with the crimping blade, a heat sink using a hard material such as copper can be manufactured by using equipment equivalent to that for aluminum.

Example 4

As shown in FIG. 13, thirty-two grooves respectively having a width of 1.5 mm and a depth of 3 mm are formed at 15 mm intervals in an aluminum base plate with a width of 500 mm, a length of 300 mm, and a thickness of 15 mm. These grooves are formed by cutting. Thirty-two aluminum fins respectively having a length of 300 mm, a height of 150 mm, and a thickness of 1.5 mm are inserted in the corresponding grooves in this base plate. Since as-inserted fins come off easily, a portion between the fins is pressed by twin crimping blades (each comprising a plurality of sub-blades running along the fin), having a forked cross section, with a blade thickness of 13.5 mm (corresponding the clearance between the fins) as shown in FIG. 13(a). The respective tip end of the sub-blades has forked projecting portions spaced 1 mm apart, and the projecting portions are arranged in a zigzag form. The projecting portions cut into the base plate to cause plastic deformation. This operation is performed in each space between the fins. Since the position of the blade (sub-blades) is fixed, as shown in FIG. 13(b), when one fin is viewed, the aluminum is plastically deformed alternately from both sides, by which the fins are integrated with the base plate. In the case where the positions of blades are equal on both sides, the crimping force between the blades sometimes weakens depending on the conditions. In this example, however, as in example 3, uniform crimping can be attained over the total length while the necessary pressing force is kept small.

As described above, by pressing the portion between the fins with the twin crimping blades (each comprising a plurality of sub-blades running along the fin), a heat sink using a hard material such as copper can be manufactured by using equipment equivalent to that for aluminum, and also the whole of fin can be crimped uniformly, so that the reliability is improved.

Example 5

As shown in FIG. 14, thirty-two grooves respectively having a width of 1.5 mm and a depth of 3 mm are formed at 15 mm intervals in the same base plate as that of example 4 except for material, that is, a copper base plate with a width of 500 mm, a length of 300 mm, and a thickness of 15 mm. These grooves are formed by cutting. Thirty-two copper fins respectively having a length of 300 mm, a height of 150 mm, and a thickness of 1.5 mm are inserted in the corresponding grooves in this base plate. Since as-inserted fins come off easily, a portion between the fins is pressed by twin crimping blades (each comprising a plurality of sub-blades running along the fin) disposed in two rows in an inclined arrangement as shown in FIG. 14(a). The angle of sub-blade with respect to the fin is 30 degrees. The interval between the sub-blades is 1.5 mm, and the length of individual blade (x) is 1.5 mm. The projecting portions cut into the base plate to cause plastic deformation. It can be thought that the total length of blade becomes long, and thus the pressing force is larger than that of example 3. Actually, however, the blade has an inclined shape, so that the plastic deformation of base plate is easy to occur. Further, the spacing of blades viewed from the fin is smaller than those as shown in FIG. 14, so that crimping can be performed more uniformly and more firmly. However, if the angle of the sub-blade with respect to the fin exceeds 45 degrees, the displacement of base material due to deformation does not crimp the fin, and the base material runs off in the lengthwise direction, so that it is difficult to obtain the effect.

As described above, by pressing the portion between the fins with the twin crimping blade (each comprising inclined plurality of sub-blades running along the fin), a heat sink using a hard material such as copper can be manufactured by using equipment equivalent to that for aluminum, and also the whole of fin can be crimped firmly, so that the reliability is improved.

The crimping blade can use the tip end of various shapes of the above-described embodiments. The pressing method using the crimping blade may be to crimp the portion between the fins one at a time or may be to crimp with several blades at a time. Also, a method in which the blade is not moved and the base plate is pressed against a fixed blade may be used. Also, the shape of the blade tip end can be changed freely according to the material, hardness, and size.

As described above, for the heat sink in accordance with the present invention, the thin-sheet fins are inserted in the grooves formed in the surface of base plate to which the thin-sheet fins are attached, and the concave portions each having a substantially trapezoidal cross section are formed continuously at the portion in the vicinity of both sides of the groove in the surface to which the thin-sheet fins are attached, so that the thin-sheet fins are crimped in the grooves by the plastic deformation. Therefore, the thin-sheet fin is compressed down to a deep position of the groove, and the thin-sheet fin is crimped firmly in the groove. The heat sink is manufactured easily by pressing the portion 4 in the vicinity of both sides of the groove in the surface to which the thin-sheet fins are attached by the pressing end portion of the pressing jig, which has the pressing end portion having a substantially trapezoidal cross section and formed into a tapered shape. Since the pressing end portion of the pressing jig has a substantially trapezoidal cross section, the pressing end portion is less liable to be broken as compared with the conventional one having a triangular cross section. The use of the pressing jig in which the pressing end portion projects discontinuously and the projecting portion has a substantially trapezoidal cross section and is formed into a tapered form can reduce the pressing force. The heat sink in which the base plate thereof consists of a heat pipe or one construction member of a heat pipe, or the base plate is joined to a heat pipe thermally has especially high heat radiation properties. Therefore, such a heat sink achieves remarkable industrial effects.

What is claimed is:

1. A heat sink comprising:
    a base plate provided with a plurality of grooves and concave portions, each of said grooves having a flat bottom face and vertical side faces and each of which concave portions has a substantially trapezoidal cross section having a flat bottom face and inclined side faces, with the vertical side faces formed at least at an upper portion thereof, and is formed into a tapered shape, formed between adjacent grooves by plastic deformation; and
    a plurality of flat thin-sheet fins having substantially uniform thickness which are inserted in said grooves and are crimped from both sides by said inclined side faces formed by said plastic deformation of said concave portion such that said vertical side faces are brought into contact with said flat thin-sheet fins.

2. The heat sink according to claim 1, wherein said concave portions are formed continuously.

3. A heat sink comprising:
    a base plate provided with a plurality of grooves and concave portions, said concave portions formed continuously, each of said grooves having a flat bottom face and vertical side faces, each of said concave portions having a substantially trapezoidal cross section having a flat bottom face and included side faces, with the vertical side faces formed at least at an upper portion thereof, and formed into a tapered shape, the concave portions formed between adjacent grooves by plastic deformation; and
    a plurality of thin-sheet fins which are inserted in said grooves and are crimped from both sides by said inclined side faces formed by said plastic deformation of said concave portion such that said vertical side faces are brought into contact with said flat thin-sheet fins.

4. A heat sink comprising:
    a base plate provided with a plurality of grooves and discontinuously formed concave portions, each of which concave portions has a substantially trapezoidal cross section having a flat bottom face and included side faces and is formed into a tapered shape, formed between adjacent grooves by plastic deformation; and
    a plurality of thin-sheet fins which are inserted in said grooves and are crimped from both sides by said inclined side faces formed by said plastic deformation of said concave portion.

5. The heat sink according to claim 3, wherein a plurality of concave portions are formed in two rows between said adjacent grooves.

6. The heat sink according to claim 5, wherein said concave portions are formed in a zigzag arrangement.

7. The heat sink according to claim 6, wherein said concave portions are formed at an angle within 45 degrees with respect to said thin-sheet fin.

8. The heat sink according to any one of claims 3 to 7, wherein said base plate comprises a heat pipe.

9. A manufacturing method for a heart sink, comprising the steps of:
    forming a plurality of grooves in a surface of a base plate to which thin-sheet fins are attached;
    inserting said thin-sheet fins in said grooves; and
    continuously applying plastic deformation to a portion in the vicinity of both sides of said groove by pressing the portion in the vicinity of both sides o said groove in the surface to which said thin-sheet fins are attached by using a pressing end portion of a pressing jig, a shape of a cross section of said pressing end portion comprising forked blades, each of said forked blades having a substantially trapezoidal cross section and formed into a tapered shape, so that said thin-sheet fins are crimped in said grooves by said plastic deformation.

10. A pressing jig used in a manufacturing method for a heat sink, the method comprising:
    forming a plurality of grooves in a surface of a base plate to which thin-sheet fins are attached;
    inserting said thin-sheet fins in said grooves; and
    applying plastic deformation to a portion in vicinity of both sides of said groove by pressing the portion in the vicinity of both sides of said groove in the surface to which said thin-sheet fins are attached by using a pressing end portion of a pressing jig, and pressing end portion having a substantially trapezoidal cross section and formed into a tapered shape, so that said thin-sheet fins are crimped in said grooves by said plastic deformation, in which cross section of a pressing end portion of said pressing jig comprises forked blades, and each of said forked blades has a trapezoidal cross section and is formed in a tapered shape.

11. The pressing jig according to claim 10, wherein said forked blades are discontinuous.

12. A manufacturing method for a heat sink, comprising steps of:
    forming a plurality of grooves each of which having a flat bottom face and vertical side faces in a surface of a base plate to which flat thin-sheet fins having substantially uniform thickness are attached;
    inserting said thin-sheet fins in said grooves; and forming concave portions, each of which has a substantially trapezoidal cross section having a flat bottom face and inclined side faces with the vertical side faces formed at least at an upper portion thereof, and is formed into a tapered shape, by plastic deformation in a portion in vicinity of both sides of said groove in the surface to which said thin-sheet fins are attached, so that said thin-sheet fins are crimped in said grooves by said vertical side faces of said grooves.

13. The manufacturing method for a heat sink according to claim 12, wherein said concave portions are formed continuously.

14. The manufacturing method for a heat sink according to claim 13, wherein two concave portions are formed between adjacent thin-sheet fins.

15. A manufacturing method for a heat sink, comprising steps of:

forming a plurality of grooves in a surface of a base plate to which thin-sheet fins are attached;

discontinuously forming concave portions, each of which has a substantially trapezoidal cross section having a flat bottom face and inclined side faces and is formed in a tapered shape, by plastic deformation in a portion in vicinity of both sides of said groove in the surface to which said thin-sheet fins are attached, so that said thin-sheet fins are crimped in said grooves.

16. The manufacturing method for a heat sink according to claim 15, wherein said concave portions are formed in two rows between adjacent thin-sheet fins.

17. The manufacturing method for a heat sink according to claim 16, wherein said concave portions are formed in a zigzag arrangement.

18. The manufacturing method for a heat sink according to claim 16, wherein said concave portions are formed at an angle within 45 degrees with respect to said thin-sheet fin.

19. A manufacturing method for a heat sink, comprising the steps of:

forming a plurality of grooves each of which having a flat bottom face and vertical side faces in a surface of a base plate to which flat thin-sheet fins having substantially uniform thickness are attached;

inserting said thin-sheet fins in said grooves; and applying plastic deformation to a portion in vicinity of both sides of said groove by pressing the portion in the vicinity of both sides of said groove in the surface to which said thin-sheet fins are attached by using a pressing end portion of a pressing jig, said pressing end portion having a substantially trapezoidal cross section and formed into a tapered shape, so that said thin-sheet fins are crimped in said grooves by said plastic deformation such that said vertical side faces are brought into contact with sides of respective of said flat thin-sheet fins.

20. The manufacturing method for a heat sink according to claim 19, wherein said plastic deformation is continuously applied to said portion in the vicinity of both sides of said groove.

21. A pressing jig used in the manufacturing method for a heat sink defined in claim 16, in which a pressing end portion of said pressing jig has a substantially trapezoidal cross section and is formed into a tapered shape.

22. A pressing jig used in the manufacturing method for a heat sink defined in claim 16, in which prescribed locations of a pressing end portion of said pressing jig project, and each of said projecting portions has a substantially trapezoidal cross section and is formed into a tapered shape.

23. A manufacturing method for a heat sink, comprising the steps of:

forming a plurality of grooves in a surface of a base plate to which thin-sheet fins are attached;

inserting said thin-sheet fins in said grooves; and discontinuously applying plastic deformation to a portion in the vicinity of both sides of said groove by pressing the portion in the vicinity of both sides of said groove in the surface to which said thin-sheet fins are attached by using a pressing end portion of said pressing jig, said pressing end portion having a substantially trapezoidal cross section and formed into a tapered shape, so that said think-sheet fins are crimped in said grooves by said plastic deformation.

24. The manufacturing method for a heat sink according to claim 23, wherein a shape of a cross section of said pressing end portion comprises forked blades, and each of said forked blades has a trapezoidal cross section and is formed into a tapered shape.

25. The manufacturing method for a heat sink according to claim 24, wherein said plastic deformation is effected in a zigzag arrangement.

26. The manufacturing method for a heat sink according to claim 24, wherein said plastic deformation is effected at an angle within 45 degrees with respect to said thin-sheet fin.

* * * * *